United States Patent
Yoon (10) Patent No.: US 9,095,080 B2
(45) Date of Patent: Jul. 28, 2015

(54) ORGANIC ELECTROLUMINESCENCE DISPLAY MODULE

(75) Inventor: Soo Yong Yoon, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 900 days.

(21) Appl. No.: 13/315,659

(22) Filed: Dec. 9, 2011

(65) Prior Publication Data

US 2012/0170223 A1 Jul. 5, 2012

(30) Foreign Application Priority Data

Dec. 29, 2010 (KR) ......................... 10-2010-0138056

(51) Int. Cl.
*H05K 7/20* (2006.01)
*H05K 7/00* (2006.01)
*G06F 1/20* (2006.01)

(52) U.S. Cl.
CPC .................................. *H05K 7/20963* (2013.01)

(58) Field of Classification Search
CPC ............ H05K 7/00; H05K 7/20; H05B 33/00;
H05B 33/02; H05B 33/04; H05B 33/10;
H05B 33/26; G09F 9/30; H01L 1/50; H01L
33/08; H01J 1/52; H01J 1/62; H01J 61/62;
H01J 17/16; H01J 17/28; H01J 11/02; F28F
3/00
USPC ....................... 361/679.46–679.55, 688, 689,
361/704–712, 715–727, 736, 752, 753;
165/80.2, 80.3, 104.33, 185; 313/504,
313/506, 509–512, 45, 46; 345/58, 60–64,
345/204–206; 349/54, 56, 58, 62, 64, 65,
349/149, 151–158, 161, 189, 190
See application file for complete search history.

(56) References Cited

U.S. PATENT DOCUMENTS

| 5,844,362 A * | 12/1998 | Tanabe et al. ................. 313/506 |
| 6,010,742 A * | 1/2000 | Tanabe et al. ................... 427/66 |
| 6,774,872 B1 * | 8/2004 | Kawada et al. ................. 345/60 |
| 6,927,826 B2 * | 8/2005 | Yamazaki ..................... 349/138 |
| 7,139,062 B2 * | 11/2006 | Saitoh .......................... 349/161 |
| 7,239,084 B2 * | 7/2007 | Kato et al. .................... 313/506 |
| 7,825,583 B2 * | 11/2010 | Kim et al. ..................... 313/504 |
| 8,405,994 B2 * | 3/2013 | Kinoe et al. .................. 361/704 |
| 8,542,497 B2 * | 9/2013 | Sakata et al. ................. 361/796 |
| 8,764,209 B2 * | 7/2014 | Hayasi et al. ................... 362/34 |
| 2003/0231271 A1* | 12/2003 | Saitoh .......................... 349/122 |

(Continued)

FOREIGN PATENT DOCUMENTS

| JP | 2003022891 A * | 1/2003 | ............ H05B 33/02 |
| JP | 02004047458 A * | 2/2004 | ............ H05B 33/04 |

(Continued)

*Primary Examiner* — Michail V Datskovskiy
(74) *Attorney, Agent, or Firm* — Lee & Morse, P.C.

(57) ABSTRACT

An organic electroluminescence display module includes a display panel including a display region and a pad region, a mold frame supporting the display panel and including a recess in a region corresponding to the pad region, and an accommodation guide hole in an edge of the recess, a driving integrated circuit chip disposed between the display panel and the accommodation guide hole, and a cover installed over the recess, a metal member being inserted in the cover. A portion of the metal member contacts the driving integrated circuit chip, and another portion of the metal member is exposed to an outside of the organic electroluminescence display module.

11 Claims, 8 Drawing Sheets

(56) References Cited

U.S. PATENT DOCUMENTS

| | | | |
|---|---|---|---|
| 2006/0113905 A1* | 6/2006 | Nakamura | 313/511 |
| 2006/0166588 A1* | 7/2006 | Kong et al. | 445/25 |
| 2007/0153458 A1* | 7/2007 | Okimoto et al. | 361/681 |
| 2009/0174319 A1* | 7/2009 | Shimoji | 313/504 |
| 2009/0302731 A1 | 12/2009 | Takamura | |
| 2011/0069495 A1* | 3/2011 | Hayasi et al. | 362/311.01 |

FOREIGN PATENT DOCUMENTS

| | | |
|---|---|---|
| JP | 2005-326757 | 11/2005 |
| JP | 2009-295486 | 6/2008 |
| JP | 2009-295487 | 12/2009 |
| KR | 10-2006-0062698 A | 6/2006 |

* cited by examiner

Fig. 9

ORGANIC ELECTROLUMINESCENCE DISPLAY MODULE

CROSS-REFERENCE TO RELATED APPLICATIONS

This U.S. non-provisional patent application claims priority under 35 U.S.C. §119 of Korean Patent Application No. 10-2010-0138056, filed on Dec. 29, 2010, the entire contents of which are hereby incorporated by reference.

BACKGROUND

1. Field

The present disclosure herein relates to an organic electroluminescence display module, and more particularly, to a slim organic electroluminescence display module having high heat dissipating efficiency.

2. Description of the Related Art

Organic electroluminescence devices are self-luminescence-type display devices, which electrically excite an organic compound to emit light. Since organic electroluminescence devices can be driven at low voltage and have high brightness, wide viewing angles, and high response speed, the organic electroluminescence devices have been regarded with much interest as next generation displays.

When an active-driving-type organic electroluminescence display apparatus includes organic electroluminescence devices, pixels that are unit devices for forming an image are arranged in the form of a matrix on a substrate, and a thin film transistor (TFT) and an organic electroluminescence device are provided to each pixel to independently control the pixels. Since such organic electroluminescence display apparatuses have no backlight unit, they can be lightweight, slim, and economical in power consumption, and thus, can be widely used in electronic appliances.

SUMMARY

According to an embodiment, there is provided an organic electroluminescence display module including a display panel including a display region and a pad region, a mold frame supporting the display panel and including a recess in a region corresponding to the pad region; and an accommodation guide hole in an edge of the recess, a driving integrated circuit chip disposed between the display panel and the accommodation guide hole, and a cover mounted in the recess, a metal member being inserted in the cover, wherein a portion of the metal member contacts the driving integrated circuit chip, and another portion of the metal member is exposed to an outside of the organic electroluminescence display module.

The metal member may include at least one of Cu, Ag, or Al.

The metal member may include a heat source contact part, an external exposure part, and a connection part connecting the heat source contact part to the external exposure part. The heat source contact part may contact the driving integrated circuit chip. The external exposure part may be exposed to the outside.

An exposed surface of the external exposure part may be coplanar with a rear surface of the mold frame.

The cover may include a first protrusion portion on a region corresponding to the accommodation guide hole, and a second protrusion portion disposed at both ends of the first protrusion portion and having a height equal to a depth of the recess. The metal member may be inserted in the first protrusion.

The heat source contact part may have an exposed surface that is wider than an exposed surface of the external exposure part.

An exposed surface of the heat source contact part may be coplanar with a protrusion surface of the first protrusion portion.

An exposed surface of the heat source contact part may protrude farther than the protrusion surface of the first protrusion portion.

The organic electroluminescence display module may further include a printed circuit board disposed between the recess and the cover and a flexible printed circuit board passing through the accommodation guide hole to connect the printed circuit board to the driving integrated circuit chip and disposed between the display panel and the driving integrated circuit chip.

The organic electroluminescence display module may further include a heat dissipation sheet disposed between the driving integrated circuit chip and the metal member.

The heat dissipation sheet may have a width wider than that of the driving integrated circuit chip.

BRIEF DESCRIPTION OF THE DRAWINGS

The accompanying figures are included to provide a further understanding of the embodiments, and are incorporated in and constitute a part of this specification. The drawings illustrate exemplary embodiments and, together with the description, serve to explain principles disclosed herein. In the figures.

DETAILED DESCRIPTION

Exemplary embodiments will be described below in more detail with reference to the accompanying drawings. Aspects may, however, be embodied in different forms and should not be construed as limited to the embodiments set forth herein. Rather, these embodiments are provided so that this disclosure will be thorough and complete, and will fully convey the scope to those skilled in the art. In the drawings, the dimensions of elements are exaggerated for clarity of illustration. Like reference numerals refer to like elements throughout.

Figure 1:
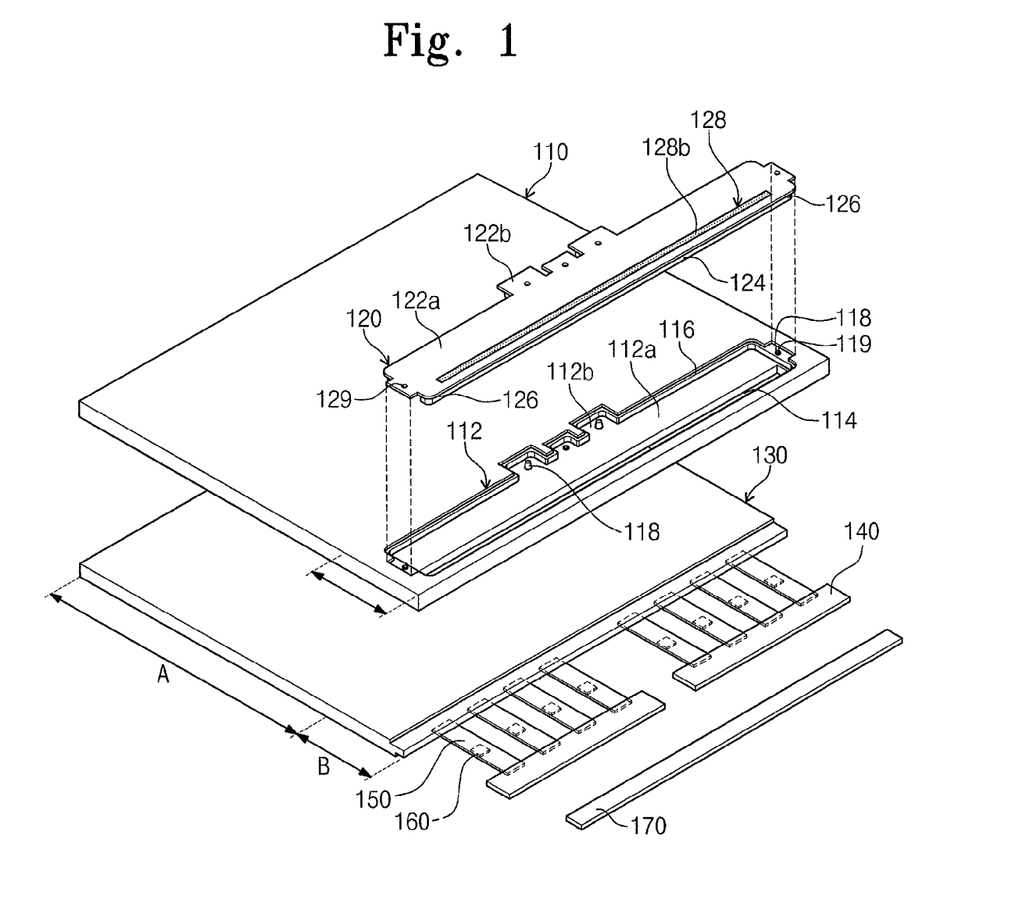
FIG. 1 illustrates an exploded perspective view relating to an organic electroluminescence display module according to an embodiment.
Figure 2:
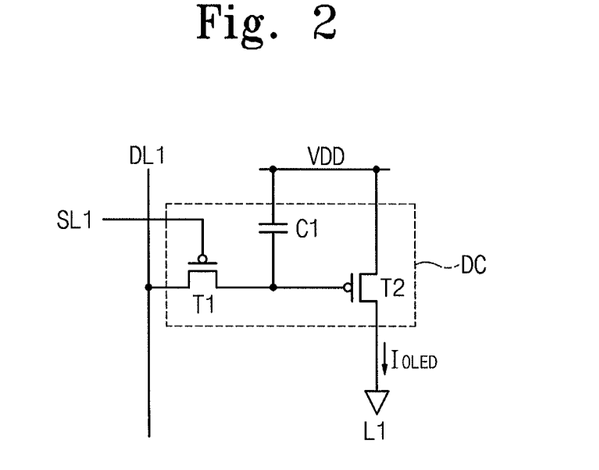
FIG. 2 illustrates an equivalent circuit diagram relating to a unit pixel of an organic electroluminescence display panel according to an embodiment.
Figure 3:
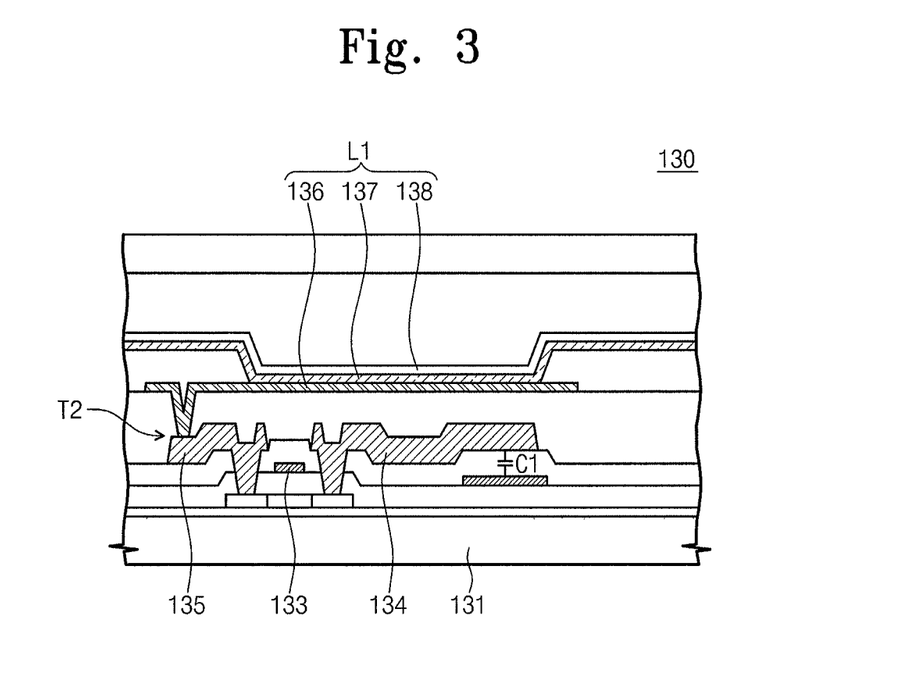
FIG. 3 illustrates a partial cross-sectional view relating to an inside of an organic electroluminescence display panel according to an embodiment.
Figure 4A:
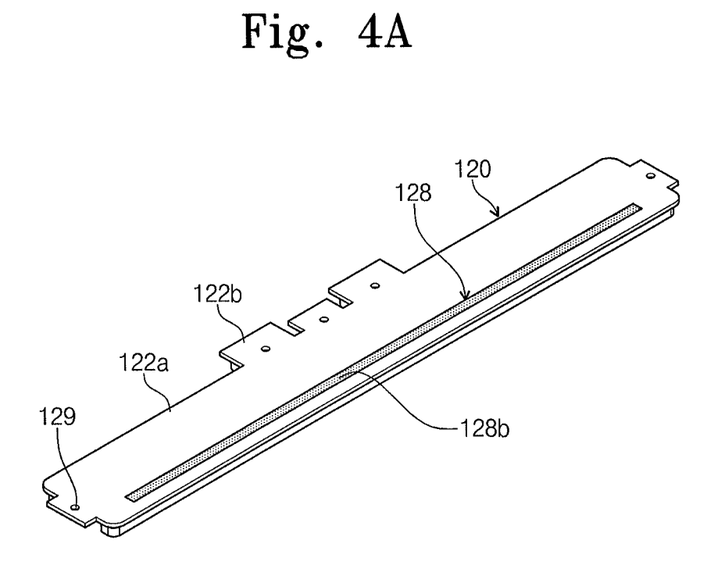
FIGS. 4A and 4B illustrate perspective views relating to the outer and inner parts of a driving printed circuit board (PCB) cover according to an embodiment.
Figure 4B:
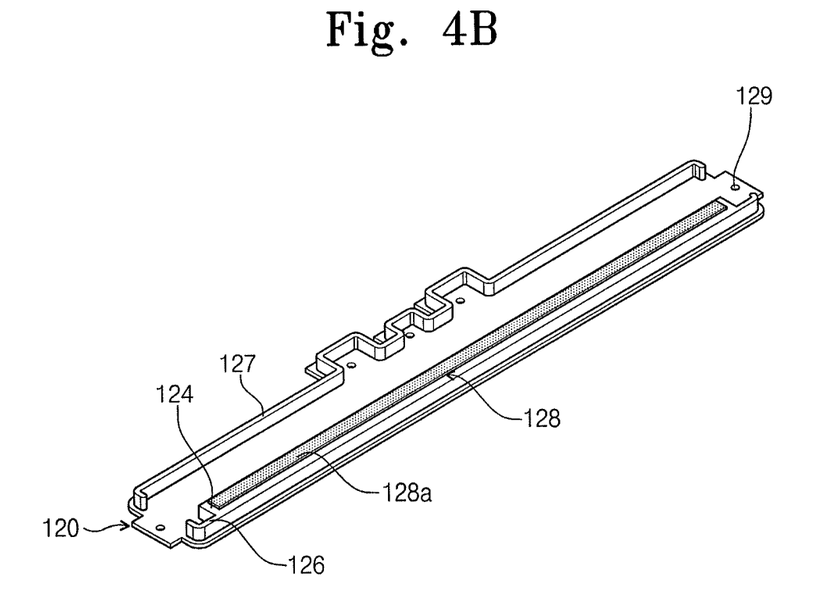

FIG. 1 is an exploded perspective view illustrating an organic electroluminescence display module according to an embodiment. FIG. 2 is an equivalent circuit diagram illustrating a unit pixel of an organic electroluminescence display panel according to an embodiment. FIG. 3 is a partial cross-sectional view illustrating an inside of an organic electroluminescence display panel according to an embodiment. FIGS. 4A and 4B are perspective views illustrating the outer and inner parts of a driving printed circuit board (PCB) cover according to an embodiment.

Referring to FIGS. 1 through 3 and FIGS. 4A and 4B, an organic electroluminescence display module 100 according to an embodiment may include a mold frame 110, a driving PCB cover 120, an organic electroluminescence panel 130, printed circuit board 140, flexible printed circuit board (FPCBs) 150, and driving integrated circuit chip 160.

The organic electroluminescence panel 130 may include a display region A configured to display an image corresponding to an input electrical signal, and a pad region B disposed at a side of the display region A. The driving integrated circuit chips 160 are mounted on the pad region B.

A plurality of the printed circuit boards 140 that apply various control signals to the organic electroluminescence panel 130, a plurality of the driving integrated circuit chips 160 that drive the organic electroluminescence panel 130, and a plurality of the flexible printed circuit boards 150 that connect the printed circuit boards 140 to the driving integrated circuit chips 160 are provided in the pad region B. The driving integrated circuit chips 160 may be mounted on the flexible printed circuit boards 150, respectively, using a chip on glass (COG) method. The driving integrated circuit chips 160 transmit driving signals to pixels disposed on the display region A of the organic electroluminescence panel 130. An end of the flexible printed circuit boards 150 may be adhered to a display surface of the organic electroluminescence panel 130, and another end may be adhered to a surface of the printed circuit boards 140.

The organic electroluminescence panel 130 includes a plurality of pixels in the form of a matrix on the display region A to display images. Referring to FIGS. 2 and 3, each of the pixels may include an organic electroluminescence device L1 and a driving circuit DC. The organic electroluminescence device L1 may include an anode electrode 136, an organic light emitting layer 137, and a cathode electrode 138. The driving circuit DC may include at least two thin film transistors T1 and T2, and at least one reservoir capacitor C1. The thin film transistors T1 and T2 may include a switching transistor (also denoted by T1) and a driving transistor (also denoted by T1).

The switching transistor T1 is connected to a scan line SL1 and a data line DL1 and transmits a data voltage from the data line DL1 to the driving transistor T2 according to a switching voltage input to the scan line SL1. The reservoir capacitor C1 is connected to the switching transistor T1 and a power line VDD and stores a voltage corresponding to a difference between a voltage transmitted from the switching transistor T1 and a voltage supplied to the power line VDD.

The driving transistor T2 is connected to the power line VDD and the reservoir capacitor C1. An output current $I_{OLED}$, which is in proportion to the square of a difference between a voltage stored in the reservoir capacitor C1 and a threshold voltage, is supplied to the organic electroluminescence device L1 by the driving transistor T2. The organic electroluminescence device L1 emits light using the output current $I_{OLED}$. The driving transistor T2 includes a gate electrode 133, a source electrode 134, and a drain electrode 135. The anode electrode 136 of the organic electroluminescence device L1 may be connected to the drain electrode 135 of the driving transistor T2.

Referring again to FIG. 1, the mold frame 110 is disposed behind the organic electroluminescence panel 130 and supports the organic electroluminescence panel 130. The mold frame 110 may include a PCB accommodation recess 112 in a region corresponding to the pad region B of the organic electroluminescence panel 130. The PCB accommodation recess 112 accommodates the printed circuit boards 140, the flexible printed circuit boards 150, and the driving integrated circuit chips 160.

The PCB accommodation recess 112 may include an accommodation guide hole 114 at an edge of the PCB accommodation recess 112 adjacent to an edge of the mold frame 110. The accommodation guide hole 114 extends in a predetermined direction (the longitudinal direction of the PCB accommodation recess 112). The printed circuit boards 140, the flexible printed circuit boards 150, and the driving integrated circuit chips 160, which are connected to the organic electroluminescence panel 130, are guided by the accommodation guide hole 114 such that they are accommodated in the PCB accommodation recess 112.

The PCB accommodation recess 112 may include a horizontal part 112a having a straight line shape, and vertical parts 112b extending from the middle of the horizontal part 112a. The mold frame 110 may include stepped parts 116 that are disposed at both ends of the PCB accommodation recess 112 and extend along the accommodation guide hole 114.

Fixing parts 118 may be provided in the vertical parts 112b and both ends of the horizontal part 112a. The fixing parts 118 have heights equal to depths of the PCB accommodation recess 112. The fixing parts 118 may have rod shape. Some of the fixing parts 118 may include a coupling concave 119 in the center thereof in the form of a donut-shaped column, so that a coupling screw can be coupled to the coupling concave 119.

Figure 7:
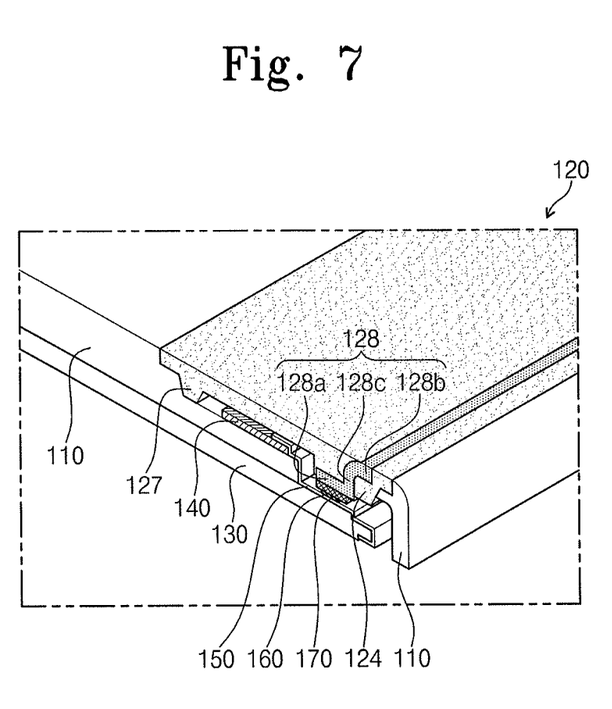
FIG. 7 illustrates a cut-away view taken along line I-I' of FIG. 5.
Figure 8:
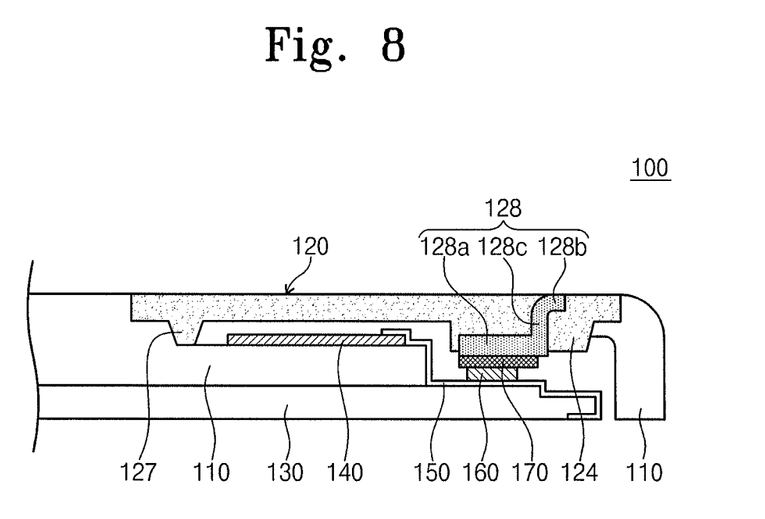
FIG. 8 illustrates a cross-sectional view taken along line I-I' of FIG. 5.

The organic electroluminescence display module 100 may further include a heat dissipation sheet 170 (FIGS. 7 and 8). The heat dissipation sheet 170 effectively transfers heat from the driving integrated circuit chips 160 to the driving PCB cover 120. The heat dissipation sheet 170 may have a width wider than that of the driving integrated circuit chips 160.

The driving PCB cover 120 protects the printed circuit boards 140, the flexible printed circuit boards 150, and the driving integrated circuit chips 160 on the pad region B. Referring to FIGS. 4A and 4B, the driving PCB cover 120 may have a shape to correspond to the PCB accommodation recess 112, and thus, can be mounted in the PCB accommodation recess 112. That is, the driving PCB cover 120 may include a horizontal part 122a having a straight line shape and vertical parts 122b extending from the middle of the horizontal part 122a, which are the same in shape and size as the PCB accommodation recess 112.

The driving PCB cover 120 may include a first protrusion portion 124 that is spaced a predetermined distance from longitudinal ends and lateral ends of the horizontal part 122a, in a region corresponding to the accommodation guide hole 114. The height of the first protrusion portion 124 may be greater than the depth of the PCB accommodation recess 112. The driving PCB cover 120 may include second protrusions 126 that are adjacent to the first protrusion 124 in the longitudinal direction of the horizontal part 122a and that are integrally formed with the first protrusion 124.

The driving PCB cover 120 may include a third protrusion 127 that is substantially parallel to the first protrusion 124 and is spaced a predetermined distance from ends of the horizontal part 122a and ends of the vertical parts 122b. The height of the third protrusion 127 may be equal to the depth of the PCB accommodation recess 112. The horizontal part 122a of the driving PCB cover 120 may have no protrusion at both ends.

The driving PCB cover 120 may be formed of its main material using a mold, and a metal member 128 may be inserted into a region of the driving PCB cover 120 provided with the first protrusion 124. For example, the metal member 128 may be formed of a metal having high heat conductivity. In more detail, the metal member 128 may be formed of at least one of copper (Cu), silver (Ag), or aluminum (Al) alloy.

The metal member 128 may be provided using an injection molding method in which the metal member 128 is added into the mold for forming a main body of the driving PCB cover 120. The metal member 128 may include a heat source contact part 128a that is exposed at the inner part of the driving PCB cover 120, an external exposure part 128b that is exposed at the outer part thereof, and a connection part 128c (refer to FIG. 7) that connects the heat source contact part 128a to the external exposure part 128b. The heat source contact part 128a may be disposed at protrusion surface of the first protrusion 124. The heat source contact part 128a may be wider than the external exposure part 128b. The heat source contact part 128a of the metal member 128 may have the same width as that of the heat dissipation sheet 170.

An exposed surface of the external exposure part 128b may be coplanar with the outer surface of the driving PCB cover 120. An exposed surface of the heat source contact part 128a may be coplanar with the protrusion surface of the first protrusion portion 124 of the driving PCB cover 120, or may protrude farther than the protrusion surface of the first protrusion 124.

The vertical parts 122b of the driving PCB cover 120 and both ends of the horizontal part 122a of the driving PCB cover 120 may include coupling holes 129 that are coupled with the fixing parts 118 of the PCB accommodation recess 112. Some of the coupling holes 129, which correspond to the fixing parts 118 having a donut column shape, may have a lower width adjacent to the organic electroluminescence panel 130 wider than an upper width.

Figure 5:
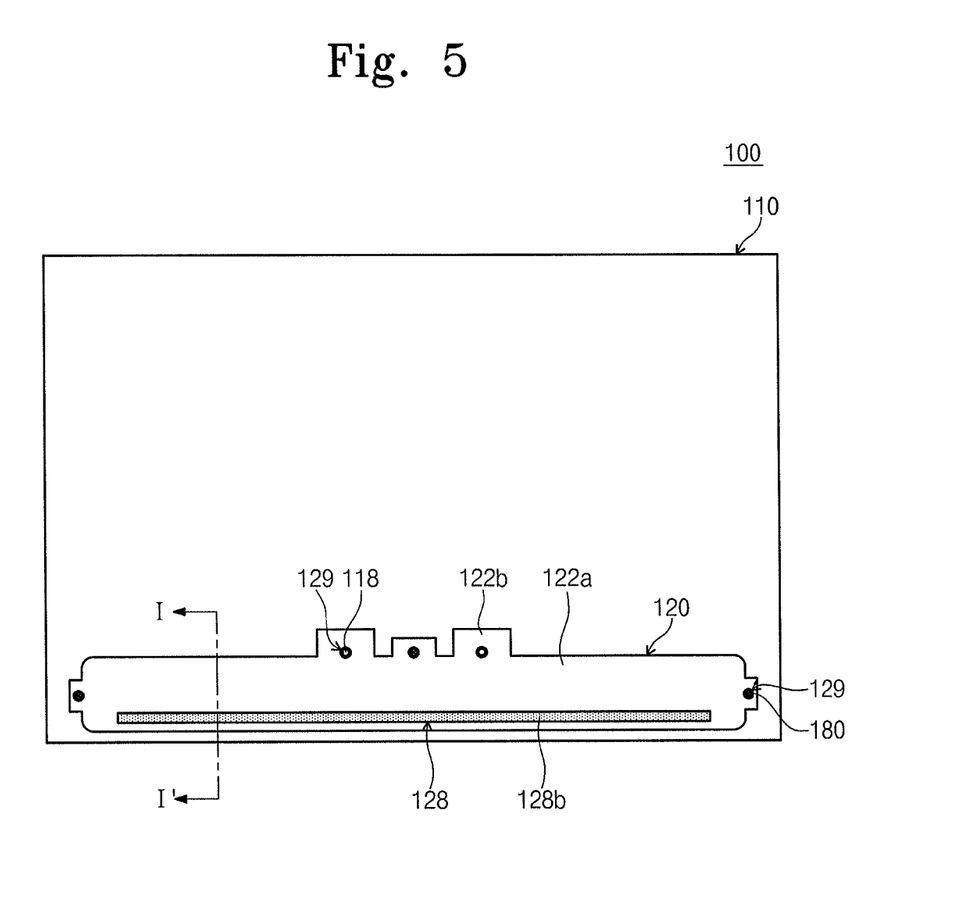
FIG. 5 illustrates a rear view relating to an assembly state of the organic electroluminescence display module of FIG. 1.
Figure 6:
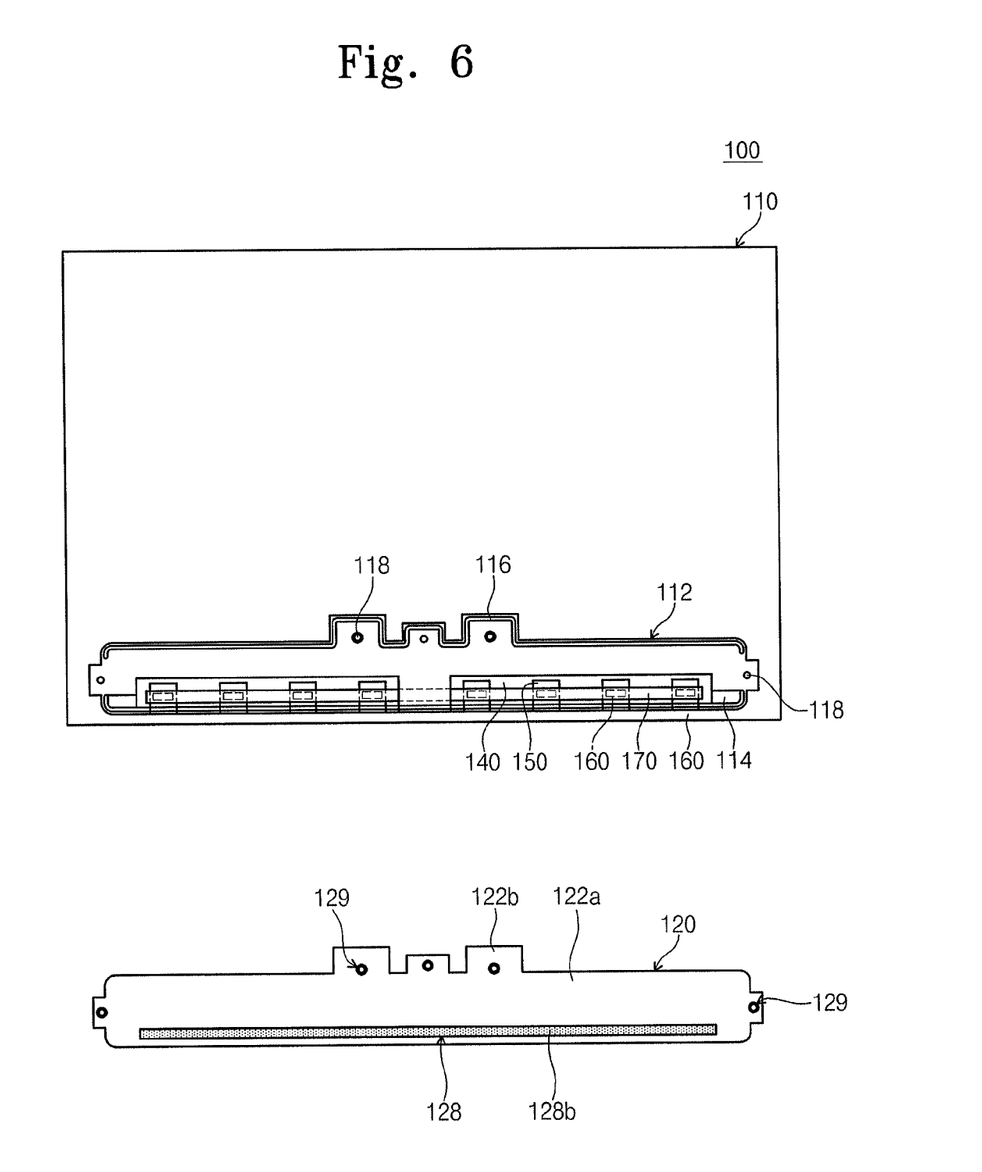
FIG. 6 illustrates a rear view relating to the organic electroluminescence display module of FIG. 5 when a driving PCB cover is opened.

FIG. 5 is a rear view illustrating an assembly state of the organic electroluminescence display module of FIG. 1. FIG. 6 is a rear view illustrating the organic electroluminescence display module of FIG. 5 when a driving PCB cover is opened. FIG. 7 is a cut-away view taken along line I-I' of FIG. 5. FIG. 8 is a cross-sectional view taken along line I-I' of FIG. 5.

Referring to FIGS. 5 through 8, the mold frame 110 is disposed under the organic electroluminescence panel 130 and supports the organic electroluminescence panel 130. The organic electroluminescence panel 130 may be adhered to the mold frame 110. For example, a double-sided adhesive tape (not shown) may be disposed between the organic electroluminescence panel 130 and the mold frame 110.

The printed circuit boards 140, which are spaced a predetermined distance from each other, may be accommodated in a region of the PCB accommodation recess 112 of the mold frame 110 disposed on the pad region B. For example, the printed circuit boards 140 may be adhered to the PCB accommodation recess 112 using a double-sided adhesive tape (not shown).

The driving integrated circuit chips 160 may be spaced a predetermined distance from each other on a portion of the organic electroluminescence panel 130 to correspond to the accommodation guide hole 114 of the mold frame 110.

The flexible printed circuit boards 150 may be disposed on the organic electroluminescence panel 130 and the printed circuit boards 140 to correspond to the driving integrated circuit chips 160. The flexible printed circuit boards 150 passing through the accommodation guide hole 114 may be bent from an end of the front surface of the organic electroluminescence panel 130 in the pad region B through the lower surface thereof to an end of the rear surface of the printed circuit boards 140, so that the flexible printed circuit boards 150 can be disposed between the organic electroluminescence panel 130 and the driving integrated circuit chips 160.

The heat dissipation sheet 170 may be disposed on the driving integrated circuit chips 160 to transfer heat from the driving integrated circuit chips 160 to the metal member 128 of the driving PCB cover 120.

The driving PCB cover 120 may be disposed over the PCB accommodation recess 112 to cover the printed circuit boards 140, the flexible printed circuit boards 150, and the heat dissipation sheet 170.

A side portion of the first protrusion portion 124 of the driving PCB cover 120 may mate with the stepped part 116 adjacent to the accommodation guide hole 114, and the inner surface of the driving PCB cover 120 may contact the heat dissipation sheet 170 through the heat source contact part 128a of the metal member 128. The external exposure part 128b of the metal member 128 is exposed to the outside from the outer surface of the driving PCB cover 120.

A side portion of the second protrusion 126 of the driving PCB cover 120 may mate with the stepped part 116 adjacent to the accommodation guide hole 114.

A side portion of the third protrusion 127 of the driving PCB cover 120 may mate with the stepped part 116 distant from the accommodation guide hole 114, another side portion thereof may face side walls of the printed circuit boards 140. That is, the printed circuit boards 140 are disposed in a space defined by the first to third protrusions 124, 126, and 127 of the driving PCB cover 120.

According to the embodiment as described above, one of the exposed surfaces of the metal member 128 inserted in the driving PCB cover 120 contacts the heat dissipation sheet 170 disposed on a heat source, and the other exposed surface is exposed to the outside of the organic electroluminescence display module 100, and thus, the organic electroluminescence display module 100 can efficiently emit heat from the driving integrated circuit chips 160 to the outside.

Furthermore, the driving PCB cover 120 is mounted in the mold frame 110 toward the organic electroluminescence panel 130 to form a flat appearance with the outer surface of the mold frame 110, thereby slimming the organic electroluminescence display module 100.

Figure 9:
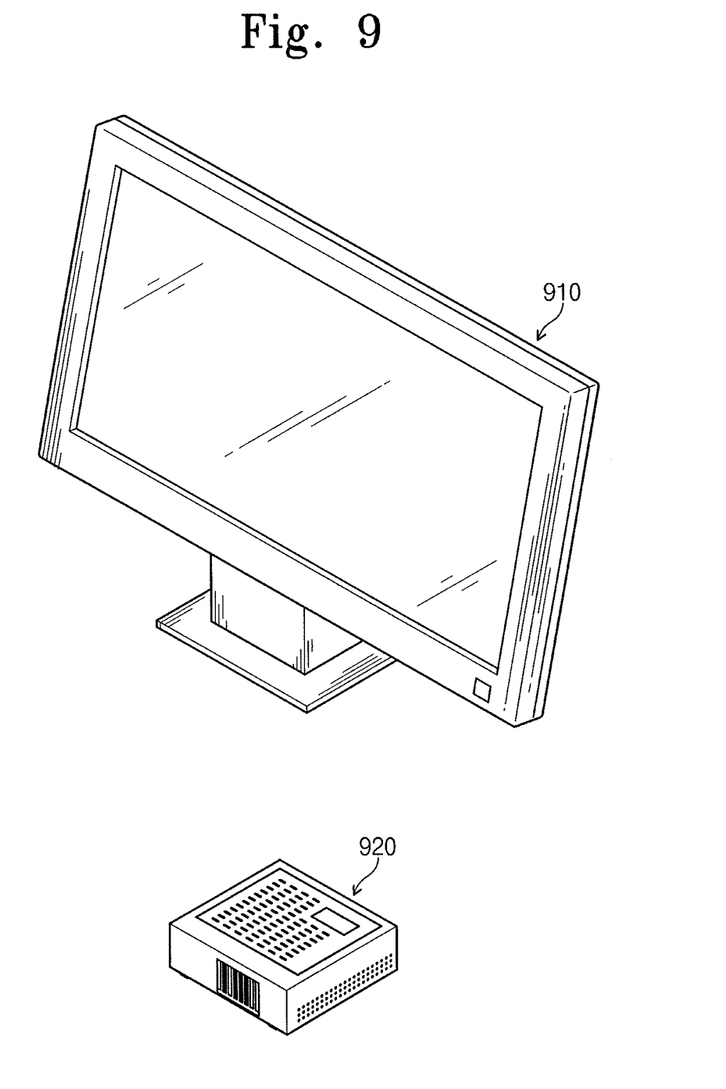
FIG. 9 illustrates a perspective view illustrating apparatuses that may include a driving PCB cover according to an embodiment.

FIG. 9 is a perspective view illustrating apparatuses that may include a driving PCB cover according to an embodiment.

Referring to FIG. 9, the driving PCB cover 120 (refer to FIG. 1) may be used in an electronic appliance such as a large-sized television 910 or a set top box 920 of the television 910 including the organic electroluminescence panel 130 (refer to FIG. 1) to more efficiently emit heat from parts of the electronic appliance. In this case, a portion of the metal member 128 (refer to FIG. 7) inserted in the driving PCB cover 120 (refer to FIG. 1) may contact a heat source (for example, a driving integrated circuit chip), and another portion thereof may be exposed to the outside.

According to the embodiment, since a portion of the metal member inserted in the driving PCB cover contacts a heat source, and another portion thereof is exposed to the outside, heat generated in the heat source can be efficiently emitted to the outside, thereby improving the heat dissipation efficiency of the organic electroluminescence display module. Since the driving PCB cover can be installed in the mold frame to form a flat appearance, the organic electroluminescence display module can be slimmed. Accordingly, the present disclosure provides a slim organic electroluminescence display module having high heat dissipating efficiency.

The above-disclosed subject matter is to be considered illustrative and not restrictive, and the appended claims are intended to cover all such modifications, enhancements, and other embodiments, which fall within the true spirit and scope thereof. Thus, to the maximum extent allowed by law, the scope is to be determined by the broadest permissible interpretation of the following claims and their equivalents, and shall not be restricted or limited by the foregoing detailed description.

What is claimed is:

1. An organic electroluminescence display module comprising:
   a display panel including a display region and a pad region;
   a mold frame supporting the display panel and including: a recess in a region corresponding to the pad region; and an accommodation guide hole in an edge of the recess;
   a driving integrated circuit chip disposed between the display panel and the accommodation guide hole; and
   a cover mounted in the recess, a metal member being inserted in the cover,
   wherein a portion of the metal member contacts the driving integrated circuit chip, and another portion of the metal member is exposed to an outside of the organic electroluminescence display module.

2. The organic electroluminescence display module of claim 1, wherein the metal member includes at least one of Cu, Ag, or Al.

3. The organic electroluminescence display module of claim 1, wherein:
   the metal member includes a heat source contact part, an external exposure part, and a connection part connecting the heat source contact part to the external exposure part,
   the heat source contact part contacts the driving integrated circuit chip, and
   the external exposure part is exposed to the outside.

4. The organic electroluminescence display module of claim 3, wherein an exposed surface of the external exposure part is coplanar with a rear surface of the mold frame.

5. The organic electroluminescence display module of claim 3, wherein:
   the cover includes a first protrusion portion on a region corresponding to the accommodation guide hole, and a second protrusion portion disposed at both ends of the first protrusion portion and having a height equal to a depth of the recess, and
   the metal member is inserted in the first protrusion.

6. The organic electroluminescence display module of claim 5, wherein the heat source contact part has an exposed surface that is wider than an exposed surface of the external exposure part.

7. The organic electroluminescence display module of claim 5, wherein an exposed surface of the heat source contact part is coplanar with a protrusion surface of the first protrusion portion.

8. The organic electroluminescence display module of claim 5, wherein an exposed surface of the heat source contact part protrudes farther inwardly than a protrusion surface of the first protrusion portion.

9. The organic electroluminescence display module of claim 1, further comprising:
   a printed circuit board disposed between the recess and the cover; and
   a flexible printed circuit board passing through the accommodation guide hole to connect the printed circuit board to the driving integrated circuit chip and disposed between the display panel and the driving integrated circuit chip.

10. The organic electroluminescence display module of claim 1, further comprising a heat dissipation sheet disposed between the driving integrated circuit chip and the metal member.

11. The organic electroluminescence display module of claim 10, wherein the heat dissipation sheet has a width wider than that of the driving integrated circuit chip.

* * * * *